US007477706B2

(12) United States Patent
Troemel, Jr.

(10) Patent No.: US 7,477,706 B2
(45) Date of Patent: Jan. 13, 2009

(54) SWITCHED CAPACITOR NETWORK FOR TUNING AND DOWNCONVERSION

(75) Inventor: Hans A. Troemel, Jr., Sharpsburg, GA (US)

(73) Assignee: Matsushita Communication Industrial Corporation of U.S.A., Peachtree City, GA (US)

( * ) Notice: Subject to any disclaimer, the term of this patent is extended or adjusted under 35 U.S.C. 154(b) by 1161 days.

(21) Appl. No.: 10/136,646

(22) Filed: May 1, 2002

(65) Prior Publication Data

US 2002/0163981 A1 Nov. 7, 2002

Related U.S. Application Data

(60) Provisional application No. 60/287,861, filed on May 1, 2001.

(51) Int. Cl.
*H04L 27/00* (2006.01)

(52) U.S. Cl. ...................................... 375/324; 375/345

(58) Field of Classification Search ................. 375/345, 375/350, 316, 324
See application file for complete search history.

(56) References Cited

U.S. PATENT DOCUMENTS 4,888,557 A 12/1989 Puckette
4,972,436 A * 11/1990 Halim et al. ................ 375/247
5,222,144 A * 6/1993 Whikehart ................... 381/15
5,557,642 A * 9/1996 Williams .................... 375/316
5,565,868 A * 10/1996 Azrouf et al. ............... 341/155
5,640,698 A * 6/1997 Shen et al. .................. 455/323
5,955,783 A 9/1999 Benefraim
6,005,506 A * 12/1999 Bazarjani et al. ............ 341/143
6,104,764 A * 8/2000 Ohta et al. .................. 375/332
6,148,048 A * 11/2000 Kerth et al. ................. 375/350
6,347,123 B1 * 2/2002 Mathe et al. ................ 375/324
6,459,458 B1 * 10/2002 Balaban ...................... 348/678
6,516,185 B1 * 2/2003 MacNally ................ 455/234.1
6,535,560 B1 * 3/2003 Masenten ................... 375/261
6,674,822 B1 * 1/2004 Legrand et al. ............. 375/355
6,819,706 B1 * 11/2004 Lim ........................... 375/130
7,110,732 B2 * 9/2006 Mostafa et al. .............. 455/130
2002/0003836 A1 * 1/2002 Azakami et al. ............ 375/239
2006/0153284 A1 * 7/2006 Souissi et al. .............. 375/219

FOREIGN PATENT DOCUMENTS

| | | |
|---|---|---|
| DE | 195 23 433 | 1/1997 |
| EP | 0 878 903 | 11/1998 |
| JP | 07-154152 | 6/1995 |
| JP | 09-191264 | 9/1997 |
| JP | 10-163912 | 5/1998 |
| WO | WO 94/05087 | 3/1994 |
| WO | WO 00-59179 | 10/2000 |

* cited by examiner

*Primary Examiner*—Chieh M. Fan
*Assistant Examiner*—Freshteh N Aghdam
(74) *Attorney, Agent, or Firm*—Laurence S. Roach

(57) ABSTRACT

An input signal (IN) is filtered (605) to remove aliases and a switched capacitor network (610) undersamples this signal to provide a downconverted, near-baseband signal. An amplifier (615) adjusts the amplitude of this signal to match a digitizer (620). The digitized output is converted into first phase and second phase signals which are then filtered (640) and decimated (645) to further reduce the sampling rate. The downconverted first and second phase signals, rather than higher frequency signals, control the gain function (AGC) for the amplifier (615). The switched capacitor network (610) provides for both tuning and downconversion of the desired signal to a lower frequency for further processing, thus reducing the frequency and power requirements of an associated amplifier and analog-to-digital converter (digitizer).

9 Claims, 7 Drawing Sheets

605
610A
615A
620A
630A
640A
645A
IN
I
IOUT
620B
625
Q
QOUT
630B
640B
645B
615B
610B
635
90°
708
655
650
660

SWITCHED CAPACITOR NETWORK FOR TUNING AND DOWNCONVERSION

PRIORITY CLAIM

This patent application claims the priority of U.S. Patent Application Ser. No. 60/287861, filed May 1, 2001.

TECHNICAL FIELD

The present invention relates to communications systems and, more particularly, discloses the use of a switched capacitor network for performing tuning and downconversion to a lower frequency for use with a subsequent amplifier or conversion stage.

BACKGROUND OF THE INVENTION

It is known to use a broadband radio frequency (RF) front end to capture a broad band of RF signals, convert this band of RF signals down to a band of intermediate frequency (IF) signals, and then select the desired signal from this band of IF signals by tuning into the IF frequency which represents the desired signal.

It has also been suggested to use switched capacitor networks to form an IF bandpass filter to eliminate signals outside of the desired band of IF signals.

It is also known to heterodyne a signal, such as an IF signal, directly to baseband to recover the communicated information, that is, the modulating signal. However, heterodyning a signal directly to baseband may cause a loss of phase (I and Q) information. Thus, in some cases, it is preferable that the signal be converted to a band which is lower in frequency than the original signal, but not converted to baseband.

To capture an entire band of signals, such as the conventional consumer FM broadcast band of 88 to 108 MHz, an IF bandwidth of 20 MHz is needed, so the IF center frequency must be above 10 MHz. For example, if an IF frequency of 25 MHz is used then the IF amplifier must have a bandpass of 15 MHz to 35 MHz. However, analog IF networks which are capable of operation at such IF frequencies and bandwidths are generally expensive, noisy, and/or lossy.

In addition, the automatic gain control (AGC) circuit must have a bandwidth similar to the IF bandwidth, which also raises the issues of cost, noise, and loss with respect to the AGC circuitry. In addition, the broadband conversion process from the RF band to the IF band results in image or adjacent signals, which may have frequencies near the desired signal frequency, and which may have a signal strength comparable to, or even greater than, the desired signal. A strong image or adjacent signal can thus cause the AGC circuit to detect a strong signal and reduce the gain accordingly, even though the strong signal is the wrong signal. These processes have the effect of raising the noise figure of the receiver, thus pushing the desired signal closer to, or sometimes even down into, the noise floor.

A switched capacitor network can be integrated onto or as part of an integrated circuit (IC), thus saving space. In addition, a switched capacitor network generally costs less than a typical IF filter and provides equivalent rejection characteristics. Further, a switched capacitor network is often less lossy than other types of IF filters, thus reducing the number of IF amplifiers. Thus, the prior art discloses several uses for, and benefits of, switched capacitor networks.

However, the prior art does not disclose or suggest that a switched capacitor network can be used to perform both tuning and down-conversion of a signal.

Further, the prior art does not disclose or suggest how an AGC control can be generated which is not responsive to the signal strength of an alias, an adjacent channel, or a spurious conversion product.

SUMMARY OF THE INVENTION

The present invention provides for the use of a switched capacitor network to provide for tuning of a desired signal and for conversion of the desired signal, such as an IF signal, to a lower IF frequency by heterodyning the desired signal to near baseband while also performing a bandpass filter function in a low pass topology.

The present invention accomplishes these functions by selecting the sampling frequency of the switched capacitor network to select the desired signal, by undersampling the input signal so as to downconvert the selected input signal to a lower, near-baseband frequency, and by selecting the characteristics of the switched capacitor network to provide the desired bandwidth. The use of a lower IF frequency also reduces the bandwidth requirements of the IF amplifier and the analog-to-digital converter, if used.

The present invention also provides for an AGC control which is not responsive to the signal strength of an alias, an adjacent channel, or a spurious conversion product. This improvement is accomplished by preserving phase information in the IF signal so as to derive in-phase and quadrature phase signals, and deriving the AGC control signal from one or both of these signals.

The present invention thus provides for the use of a lower cost switched capacitor network and a lower cost AGC amplifier circuit in communications devices.

The present invention provides a method for processing a desired signal by providing a sampling signal which has a sampling frequency, less than the center frequency of the desired signal, a harmonic of the sampling frequency being related to the center frequency of the desired signal, filtering the desired signal through a switched capacitor network which is clocked at the sampling frequency to provide a downconverted desired signal, and recovering a first phase signal and a second phase signal from the downconverted desired signal.

In one embodiment of the present invention the amplitude of any signal is adjusted as necessary. In another embodiment of the present invention the harmonic of the sampling frequency is within a predetermined offset from the center frequency of the desired signal.

Other embodiments of the present invention provide that the downconverted desired signal is interpolated to provide an interpolated desired signal, the downconverted desired signal is mixed with a mixing signal to provide the first phase signal, and the interpolated desired signal is mixed with the mixing signal to provide the second phase signal.

Other embodiments of the present invention provides that filtering the desired signal through a switched capacitor network is accomplished by providing the desired signal to a first switched capacitor network being clocked at the sampling frequency at a first phase to provide a first downconverted desired signal, providing the desired signal to a second switched capacitor network being clocked at the sampling frequency at a second phase to provide a second downconverted desired signal, the first phase and the second phase differing by approximately 90 degrees. In this case the first phase signal and the second phase signal are recovered by interpolating the second downconverted desired signal to provide an interpolated desired signal, mixing the first desired signal with a mixing signal to provide the first phase signal, and mixing the interpolated desired signal with the mixing signal to provide the second phase signal.

In the case where the desired signal has a first phase desired signal and a second phase desired signal the desired signal is filtered through a switched capacitor network by providing the first phase desired signal to a first switched capacitor network to provide a first phase downconverted desired signal, providing the second phase desired signal to a second switched capacitor network to provide a second phase downconverted desired signal. In this case the first phase signal and the second phase signal are recovered by mixing the first phase downconverted desired signal with a mixing signal to provide the first phase signal, and mixing the second phase downconverted desired signal with the mixing signal to provide the second phase signal.

The present invention also provides that the first phase signal and the second phase signal may be recovered by providing the downconverted desired signal as the first phase signal, interpolating the downconverted desired signal to provide an interpolated desired signal, and providing the interpolated desired signal as the second phase signal.

The present invention further provides that a first phase output signal may be provided by decimating the first phase signal and a second phase output signal may be provided by decimating the second phase signal.

The present invention also provides a receiver for receiving a desired input signal having a center frequency. The receiver has a switched capacitor network for sampling the desired input signal at a sampling frequency to provide a downconverted desired signal, the sampling frequency being less than the center frequency of the desired input signal, a harmonic of the sampling frequency being related to the center frequency of the desired input signal. The receiver also has a phase recovery circuit functionally connected to the switched capacitor network and responsive to the downconverted desired signal for providing a first phase signal and a second phase signal.

In the receiver, there may also be a filter circuit prior to the switched capacitor network for removing at least some undesired signals.

In the receiver, there may also be an amplifier circuit interposed between the switched capacitor network and the phase recovery circuit for controlling the amplitude of the downconverted desired signal.

In the receiver, the signal recovery circuit may comprise an analog-to-digital converter for converting the downconverted desired signal into a digital downconverted desired signal.

In the receiver, there may also be decimators functionally connected to the phase recovery circuit and responsive to the first phase signal and the second phase signal for providing a first phase output signal and a second phase output signal.

In the receiver, there may also be an amplifier circuit prior to the switched capacitor network for controlling the amplitude of the desired input signal.

Other objects, features, and advantages of the present invention will become apparent upon reading the following description of the preferred embodiments when taken in conjunction with the drawings and the claims.

DETAILED DESCRIPTION OF THE INVENTION

Figure 1:
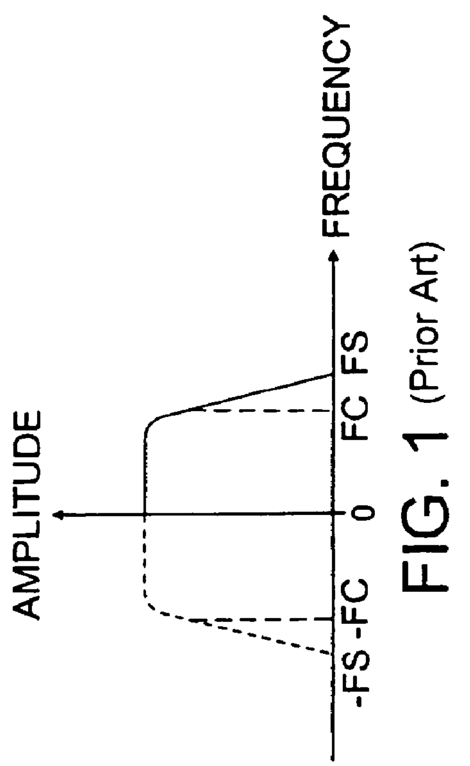
FIG. 1 shows the output spectrum of a switched capacitor network within the first Nyquist bandwidth.

FIG. 1 shows the output spectrum within the first Nyquist bandwidth of a switched capacitor network, such as a switched capacitor filter (an "SC network"), and having a sampling rate or frequency (FS). This output spectrum appears to be a simple low-pass function, with a frequency range of zero (DC) to the cutoff frequency (FC). However, if one considers both positive and negative frequencies, this spectrum appears more as a bandpass function, with a frequency range of −FC to +FC.

Figure 2:
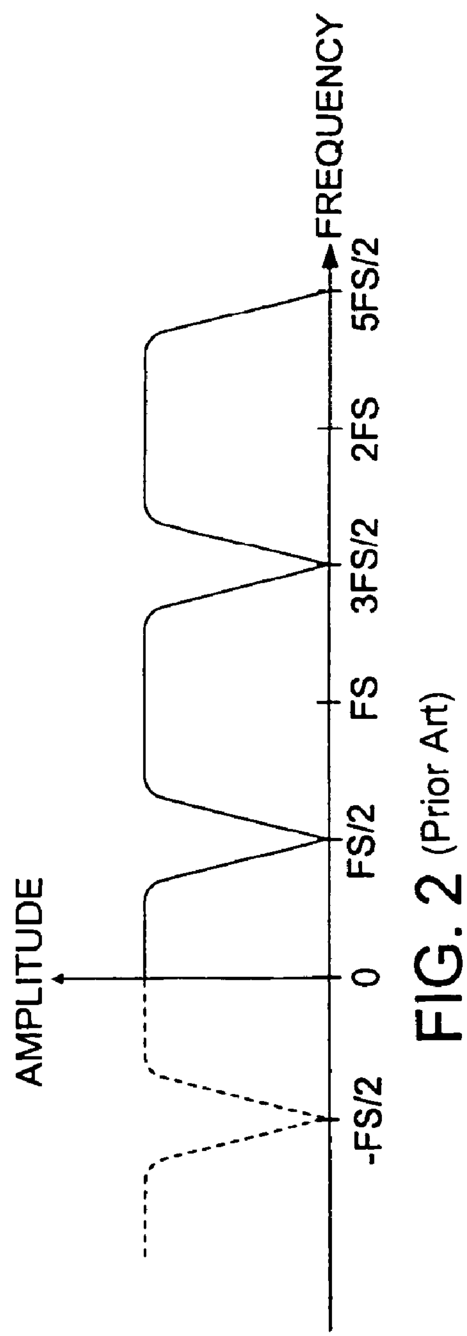
FIG. 2 illustrates the equivalent bandpass filter characteristics of an SC network.

An SC network is an analog device in that the input voltage and the output voltage are not limited to discrete logic 0 or logic 1 values, but may be any voltage within the operating voltage range of the SC network. However, an SC network may also be viewed as a digital device or a non-linear analog device in that the input is sampled at discrete points in time and the output changes at discrete points in time, as determined by the sampling frequency FS. Therefore, in accordance with sampling theory, the filtering characteristics of the SC network replicate the spectrum at multiples of the sampling frequency FS. FIG. 2 thus illustrates the equivalent bandpass filter characteristics of an SC network.

Using what is conventionally understood to be the Nyquist criteria for sampling, the sampling frequency has to be at least twice as high as the highest frequency to be sampled. If the signal was an IF signal in the range of 15 to 35 MHz, then the sampling frequency would have to be at least 70 MHz. However, the Nyquist criteria actually only requires that the sampling frequency be at least twice as high as the highest bandwidth in the signal to be sampled. If the signal is an IF signal in a typical consumer FM radio, the bandwidth of a channel, including the guards bands, is 200 kHz. Thus, the sampling signal would only need to be greater than 400 kHz.

From sampling theory, it will be recalled that when an input signal is sampled the resultant output is analogous to mixing the sampling signal with the input signal and, therefore, the resultant output contains the original input signal, the sampling signal, and the sum and difference frequencies of the original signal and the sampling signal. The sampling signal has a component at the fundamental sampling frequency FS. However, in accordance with the sampling theorem, and due to the fact that the sampling process and the sampling signal are non-linear, the sampling signal also has components at the harmonics of the sampling frequency, such as 2*FS, 3*FS, etc. Therefore, the resultant output also has sum and difference frequencies of the original input signal and the sampling signal harmonics 2*FS, 3*FS, etc.

These characteristics are advantageously used in the present invention. Namely, the sampling frequency is not twice the IF frequency. Rather, the IF signal is undersampled, but is sampled at a rate which is adequate to preserve the information contained in the IF signal. In addition, the sampling frequency is selected so that one of the harmonics will provide a down-converted, near-baseband signal.

Figure 3:
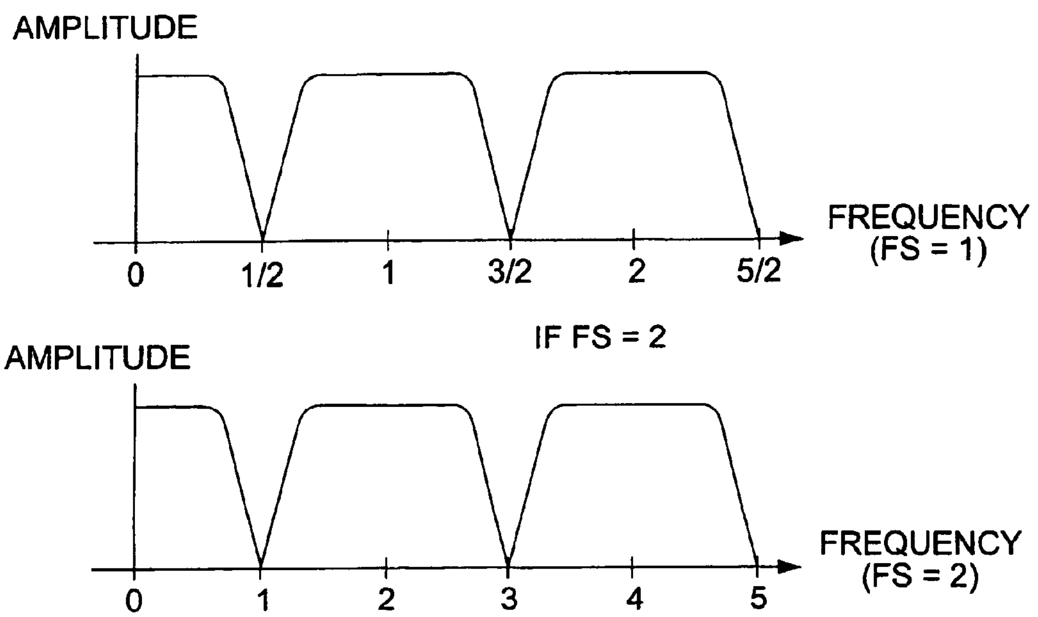
FIG. 3 shows the effect of the sampling frequency on the center frequency of the bandpass functions for an SC network.

FIG. 3 shows the effect of the sampling frequency on the center frequency of the bandpass functions for an SC network. Note that changing FS changes the center frequency of the bandpass functions. For example, using a hypothetical FS of 1 yields center frequencies at 1 (FS), 2 (2*FS), 3 (3*FS) etc. However, changing FS to 2 yields center frequencies of 2 (FS), 4 (2*FS), 6 (3*FS), etc. Thus, the SC network can be tuned by changing FS. In other words, a particular IF signal in a band of IF signals can be selected by proper selection of FS.

An SC network has another feature that can be used for benefit. The bandwidth of the SC network is fixed and is not a function of FS. This feature arises because the Q of the SC network is a function of FS. Therefore, if FS is changed, the Q changes accordingly, and the bandwidth thus remains constant. Thus, for a system wherein all of the desired channels have the same bandwidth, it is not necessary to separately adjust the bandwidth when FS and the desired channel are changed.

However, a multi-purpose system may need to accommodate channels which have different bandwidths. Another feature of the SC network is that the bandwidth can be changed, if desired. An SC network includes fixed capacitors as part of the network. One can use varactors in conjunction with, or instead of, one or more of the fixed capacitors normally present in an SC network. For example, one can replace capacitors within the SC network with varactors. One can also connect varactors in parallel or in series with capacitors in the SC network. The varactors allow the bandwidth or Q of the SC network to be varied or adjusted. One can also switch capacitors in and out, instead of, or in addition to, using varactors. Therefore, both the center frequency and the Q of the SC network can be controlled for benefit. In other words, FS can be selected to downconvert the desired signal, and the Q can be selected to provide the desired bandwidth for the particular signal.

Figure 4:
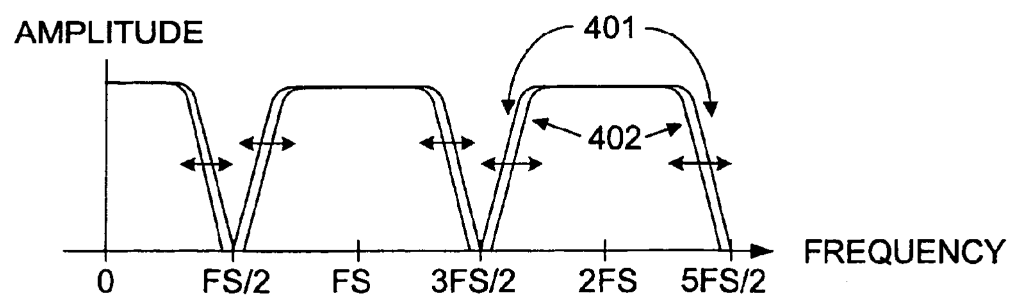
FIG. 4 is an illustration of the variable bandwidth of an SC network.

FIG. 4 is an illustration of the variable bandwidth of an SC network showing a broader bandwidth 401, such as in FIGS. 1-3, and a slightly narrower bandwidth 402.

In the preferred embodiment, to save cost and space, and to improve performance, the varactor is preferably created as part of, and along with, the SC network on an integrated circuit chip or die. However, it will be appreciated that surface mount or technology or other discrete components could be used, but cost, space, and/or performance may suffer.

Figure 5A:
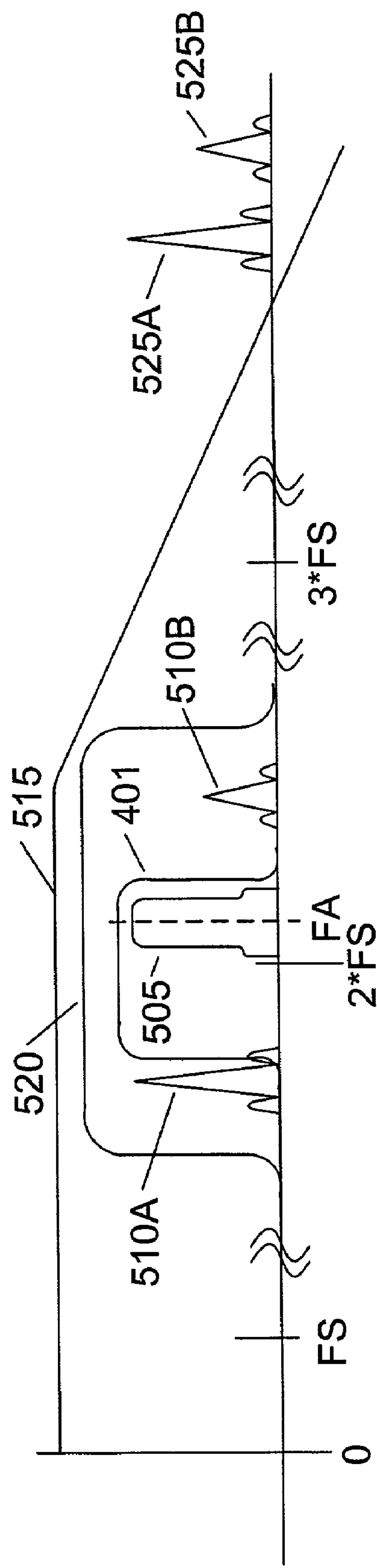
FIGS. 5A and 5B are an illustration of the spectrum of the preferred embodiment of the present invention.
Figure 5B:
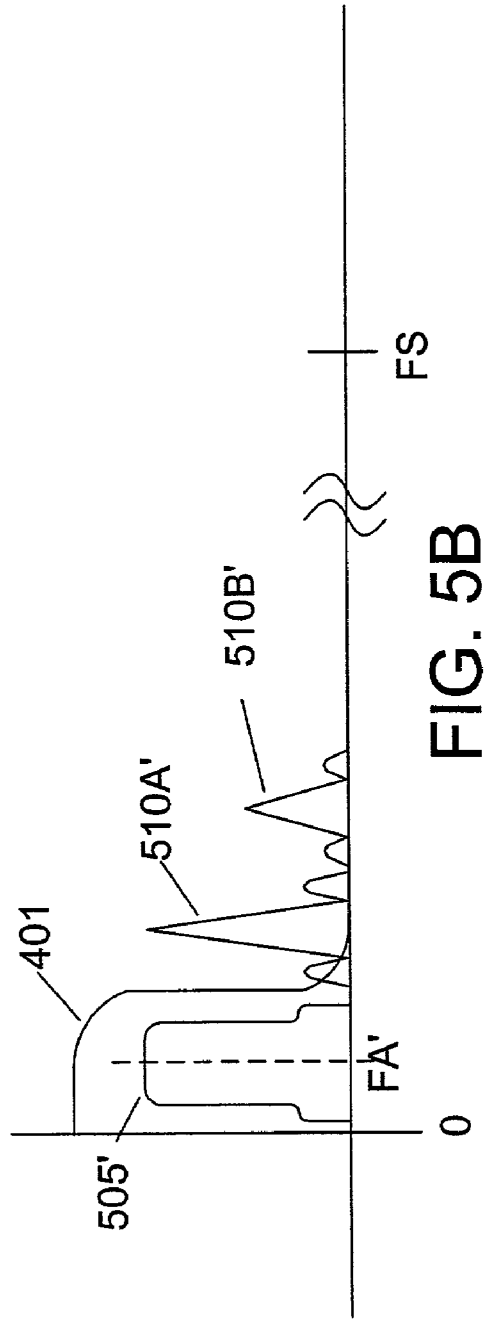

FIGS. 5A and 5B are an illustration of the spectrum of the preferred embodiment of the present invention. In the example of FIG. 5A a desired input band of signals 520 includes a desired signal 505, having a center frequency of FA, and other signals 510A and 510B, which are in the same band 520 but are not the desired signals. Also shown are other, spurious signals 525A and 525B, such as harmonics, intermodulation and distortion products, out of band signals, etc. A conventional lowpass filter (605 in FIG. 6) has a lowpass characteristic 515. This filter is used as an anti-aliasing filter for the rest of the network. Thus, the spurious signals 525A and 525B fall outside the lowpass band 515 and are attenuated or eliminated. A bandpass filter may also be used instead of a lowpass filter.

The band 520 is sampled by an SC network (610 in FIG. 6) having a sampling frequency FS. Note that FS is below FA. However, the harmonics of FS, namely, 2*FS, 3*FS, etc., are present because the sampling signal is a non-linear signal.

In the example shown, the harmonic at 2*FS mixes with the desired signal 505 to downconvert signal 505 to a near-baseband signal 505' which has a center frequency of FA'. The undesired in-band signals 510A and 510B will also downconverted and appear as signals 510A' and 510B'. Note that signal 510A' has been downconverted into the negative frequency domain but wraps around the zero frequency axis.

However, recall that the SC network has a bandpass characteristic 401. The undesired in-band signals 510A' and 510B' are outside of this band. Thus, the SC network reduces or eliminates the signals 510A' and 510B'. Thus, only a downconverted desired signal 505' remains. It should be noted that the downconversion process preserves the phase information that is present in the original desired IF signal 505. Also note that the desired signal has been downconverted to near baseband, so the circuitry following the SC network can have reduced frequency and bandwidth requirements, thus saving power, heat dissipation, size, and cost.

Assume, from the example above, that the band 520 is the consumer FM band, 88 MHz to 108 MHz. By the conventional Nyquist criteria, the sampling frequency must therefore be at least 216 MHz (two times 108 MHz). However, the present invention uses two different criteria for determining the sampling frequency. First, the sampling frequency must be greater than twice the bandwidth of the desired band. The bandwidth of the desired exemplary band is 20 MHz, so twice the bandwidth is 40 MHz. Thus, the sampling frequency must be greater than 40 MHz. Second, the N times the sampling frequency should be approximately the center frequency of the desired signal. Assume that the center frequency FIF of the desired signal 505 is 98.1 MHz. Thus, the N times the sampling frequency must be greater than 98.1 MHz. Applying these two criteria, the sampling frequency must be greater than 40 MHz, and the sampling frequency should be approximately 98.1/N MHz. These conditions are satisfied for N=2, and so the sampling frequency FS should be approximately 49.05 MHz. Note that this is less than one-quarter of the sampling frequency (216 MHz) specified using the conventional Nyquist criteria. Therefore, the SC network of the present invention can operate at a substantially reduced sampling frequency.

In the example shown, if FS is 49.05 MHz, then 2*FS is 98.1 MHz. This would downconvert the desired signal 505 completely to baseband. This may be acceptable for some applications. However, many applications require that the phase information be recovered. If the desired signal is converted directly to baseband, then phase jitter in the sampling signal, phase distortion from multi-pathing in the received signal, 1/f noise, and other problems occur which make conversion to baseband less than desirable.

However, if the sampling frequency FS is reduced slightly, for example, to 49 MHz, then 2*FS is 98 MHz, so FA' becomes 100 kHz. The desired signal has thus been downconverted to near-baseband.

In the above application, this is acceptable because the actual downconverted signal will appear in the range of 25 kHz to 175 kHz, with a 25 kHz guard band on each side. However, some applications may not have such a guard band, or may have a much smaller guard band, and therefore the circuitry following would need to operate to near DC. This is generally undesirable because of drift, 1/f noise, etc. Therefore, in such applications, the sampling frequency may be reduced even more, so that the entire desired signal is substantially above zero frequency. For example, if the desired signal 505 had an actual bandwidth of 200 kHz, rather than a bandwidth of 150 kHz with guardbands of 25 kHz, then the sampling frequency FS could be reduced even more, for example, to 48.9 MHz, which would cause 2*FS to be 97.8 MHz, so the center frequency FA' of the downconverted signal would be 300 kHz, and the desired signal would extend from 100 kHz to 300 kHz.

Therefore, according to the present invention, by properly selecting FS and using a harmonic of FS to provide for downconversion of the desired signal, the SC network may use a lower FS and undersample the desired IF signal, thus reducing the power, bandwidth, and heat dissipation requirements, and the cost, of the SC network any components following the SC network, such as an IF amplifier, gain controlled IF amplifier, digitizer. Further, phase information has been easily preserved without the need for very low noise power supplies, very low phase jitter oscillators, low 1/f noise devices, etc.

If the bandwidth 401 provided by the SC network is much larger than that required for the desired signal 505', then a strong signal 510A' in the desired band may have sufficient energy to affect the total energy present in the passband 401. Thus, the response of an AGC detector which was simply responsive to the total signal strength present in the passband 401 could be adversely affected by the signal 510A'. Thus, a strong signal 510A' could degrade the desired signal 505', or even push it down into the noise floor.

In some applications, where there are no very strong other signals 510A, this is not a problem. However, in other applications there may be a very strong signal 510A'. Thus, in the preferred embodiment, the AGC control signal is not determined by the total signal strength present in the passband 401. Rather, in the preferred embodiment, the desired signal 505A' is phase-detected to recover the I and Q signals. The amplitude of the I signal or the amplitude of the Q signal, or both, is then used to determine the AGC control value.

Thus, the present invention uses an SC network to provide several advantages: downconverting a desired signal to a near-baseband frequency, filtering that signal to remove undesired signals, and preserving phase information. The present invention also has the advantage that an AGC control signal can be provided which is responsive to the desired signal 505 but not to an undesired signal 510.

Figure 6:
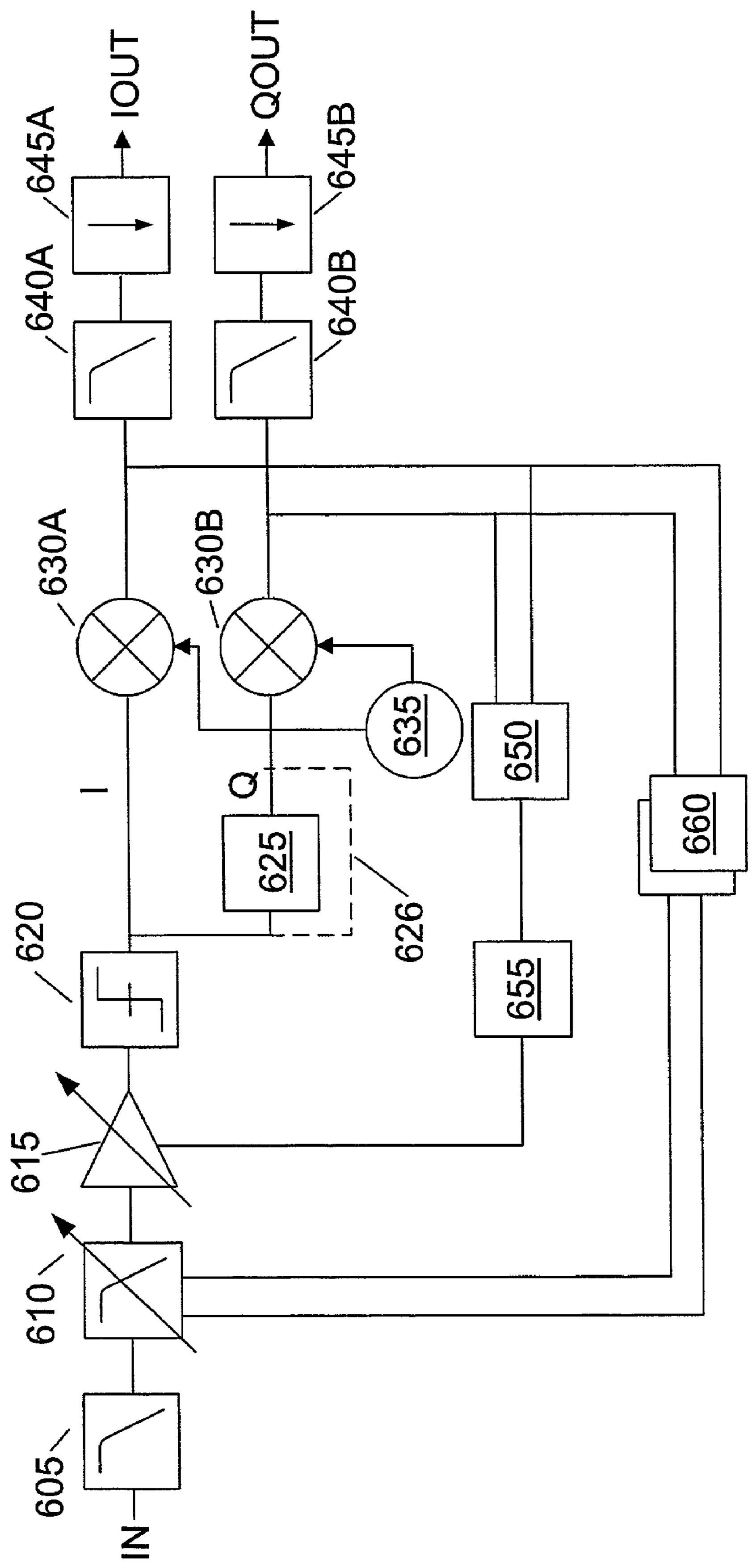
FIG. 6 is a block diagram of the preferred embodiment of the present invention.

FIG. 6 is a block diagram of one embodiment of the present invention. An input signal stream (IN) is provided to a conventional anti-aliasing bandpass or lowpass filter 605 which removes signals which are outside of or above, respectively, the desired band of signals, as mentioned above. This filtered output from filter 605 is provided to the SC network 610 of the present invention. As mentioned above, the sampling rate of this SC network 610 is adjustable so that network 610 performs both tuning and downconversion of the desired signal in the desired band of signals. Also as mentioned above, the bandwidth of this SC network 610 may be fixed for applications in which a fixed bandwidth is acceptable or desirable, or may be adjustable for applications which require an adjustable bandwidth.

The downconverted signal from network 610 is provided to the input of an automatic gain control (AGC) controlled amplifier 615, such as an IF amplifier. Note that the signal at this point is the signal 505' in bandpass 401 and signal 505' has a center frequency of FA'. Therefore, amplifier 615 may be a low-cost low-bandwidth amplifier. Further, amplifier 615 may provide for further lowpass or bandpass filtering of the signal if the bandpass 401 is larger than desired. Thus, the bandpass requirements of the network 610 may be relaxed to provide cost savings and the amplifier 615 may then be used to provide a desired narrower bandwidth.

It will be recalled that, at this point, the downconverted signal is still an analog signal. In the preferred embodiment this downconverted analog signal is converted to a digital signal for further processing. A digitizer 620 performs this conversion. The digitizer 620 may be any desired device or method for providing a digital representation of the analog signal. One example of a digitizer 620 is an analog-to-digital converter (ADC). The type of ADC used is not critical as long as it accommodates the desired input voltage range and desired input signal bandwidth. Thus, for example, and not by way of limitation, the ADC may be a successive approximation ADC, flash ADC, sigma-delta ADC or an R-2R ladder network ADC. However, for best performance, it is preferred that the amplitude of the downconverted analog signal match the analog input amplitude range of the digitizer 620. Therefore, amplifier 615 amplifies (or attenuates, as necessary) the signal from the output of network 610 so as to match the analog input amplitude range of the digitizer 620. Note that the signal at this point is the signal 505' in bandpass 401 and signal 505' has a center frequency of FA'. Note that the digitizer 620 only needs to be able to sample at a rate fast enough for the frequencies involved in the downconverted signal, that is, those within the bandwidth 401 or a narrower bandwidth provided by the amplifier 615. The digitizer 620 does not need to be able to sample at the much higher rate required for the input signal stream IN. Thus, the present invention provides for reducing the sampling speed requirements of the digitizer 620, which reduces the power consumption, the heat dissipation, and the cost of the digitizer 620.

The digitized signal is then split into two paths. An in-phase (I) signal is provided to one input of a first complex digital mixer 630A. The I signal is also provided to an interpolation filter 625, which provides a quadrature-phase (Q) signal to one input of a second complex digital mixer 630B. An oscillator 635 provides a complex mixer signal $e^{jwt}$, which has a frequency of FA', to the other inputs of complex mixers 630A and 630B so as to provide for coherent detection of the I and Q signals.

In an alternative embodiment, the interpolation filter 625 is eliminated, as indicated by the dashed line 626, so the output of digitizer 620 is provided directly to the inputs of both complex mixers 630A and 630B, and the oscillator 635 has two outputs, a first output which is provided to complex mixer 630A, and a second output, which is phase-shifted by 90 degrees, which is provided to complex mixer 630B.

In either embodiment, complex mixers 630A and 630B convert the I and Q signals, at the center frequency FA', into baseband I and Q signals, thus performing demodulation of the signal 505A.

The baseband I and Q signals are then lowpass (or bandpass) filtered by filters 640A and 640B, respectively, to remove the original signals and higher frequency conversion products. These filters are preferably FIR filters or other high-Q digital filters.

At this point, note that the I and Q signals are at a sampling rate which is in excess of what is now needed to preserve the desired information, such as the modulating signal. The I and Q signals may be used at this sampling rate or, in order to reduce sampling noise, the outputs of filters 640A and 640B may be provided to decimators 645A and 645B, respectively, which provide decimated baseband IOUT and QOUT signals which will have a sampling rate commensurate with their highest frequency.

The IOUT and QOUT outputs are then provided to other, downstream circuitry (not shown), for further processing and conversion to voice, data, fax, or other desired communication signal. Thus, the input signal has been sampled and downshifted, interpolated, and complex-converted down to baseband, and a first phase output signal (which may be either the I channel or the Q channel) and second phase output signal (which is the other channel) have been provided, where the first phase output signal and the second phase output signal preferably differ by 90 degrees.

Therefore, the receiver of the present invention may be considered as including a switched capacitor network (610) for sampling a desired input signal (IN) at a sampling frequency (FS) to provide a downconverted desired signal, and a phase recovery circuit (625, 626, 630A, 630B, 635) functionally connected to said switched capacitor network and responsive to said downconverted desired signal for providing a first phase signal and a second phase signal. The sampling frequency is less than the center frequency of the desired input signal, and a harmonic of the sampling frequency is related to the center frequency of the desired input signal. Filtering (640A, 640B) and decimation (645A, 645B) may also be added, or may be considered to be part of the phase recovery circuit. AGC amplifiers (615) and ADCs (620) may also be present. In addition, AGC control circuitry (650, 655) and tuning control circuitry (660) may also be present.

The outputs of complex mixers 630A and 630B are also provided to an AGC detector 650 and then to an integrator (or a low pass filter) 655. The output of integrator 655 is preferably an analog AGC signal for controlling amplifier 615. However, that output may be digital if digital control signals are accepted by amplifier 615. Otherwise, the processing performed by detector 650 and integrator 655 may be analog or digital, or a combination thereof, as desired. Detector 650 may be responsive to the IOUT signal output from complex mixer 630A, may be responsive to the QOUT signal output from complex mixer 630B, or may be responsive to some combination of both signals. Peak signal detection, average signal detection, or any other desired detection scheme may be used.

Tuning control circuit 660 provides for tuning and selection of the bandwidth of the SC network 610 based upon external selection of the channel or mode of operation. For example, if the present invention is used in a consumer FM receiver, the tuning control signal is generated based upon the channel or frequency selected by the user and the bandwidth control signal will not be necessary as the bandwidth of the network 610 is fixed. The tuning control signal may be generated by a direct digital frequency synthesizer, a numerically controlled oscillator (NCO), a phase locked loop (PLL), a digital phase locked loop (DPLL), a delay locked loop (DLL), or any other desired device or algorithm.

However, in other applications, the bandwidth may be variable and so will be controlled by the tuning circuit 660. For example, if the present invention is used in a cellular telephone, the tuning control signal is generated based upon the channel or frequency selected by the mobile telephone switching office or controller. The bandwidth control signal is then based upon the channel or frequency selected and also upon the mode of operation selected, such as AMPS, NAMPS, FDMA, TDMA, CDMA, PCS, etc.

Figure 7:
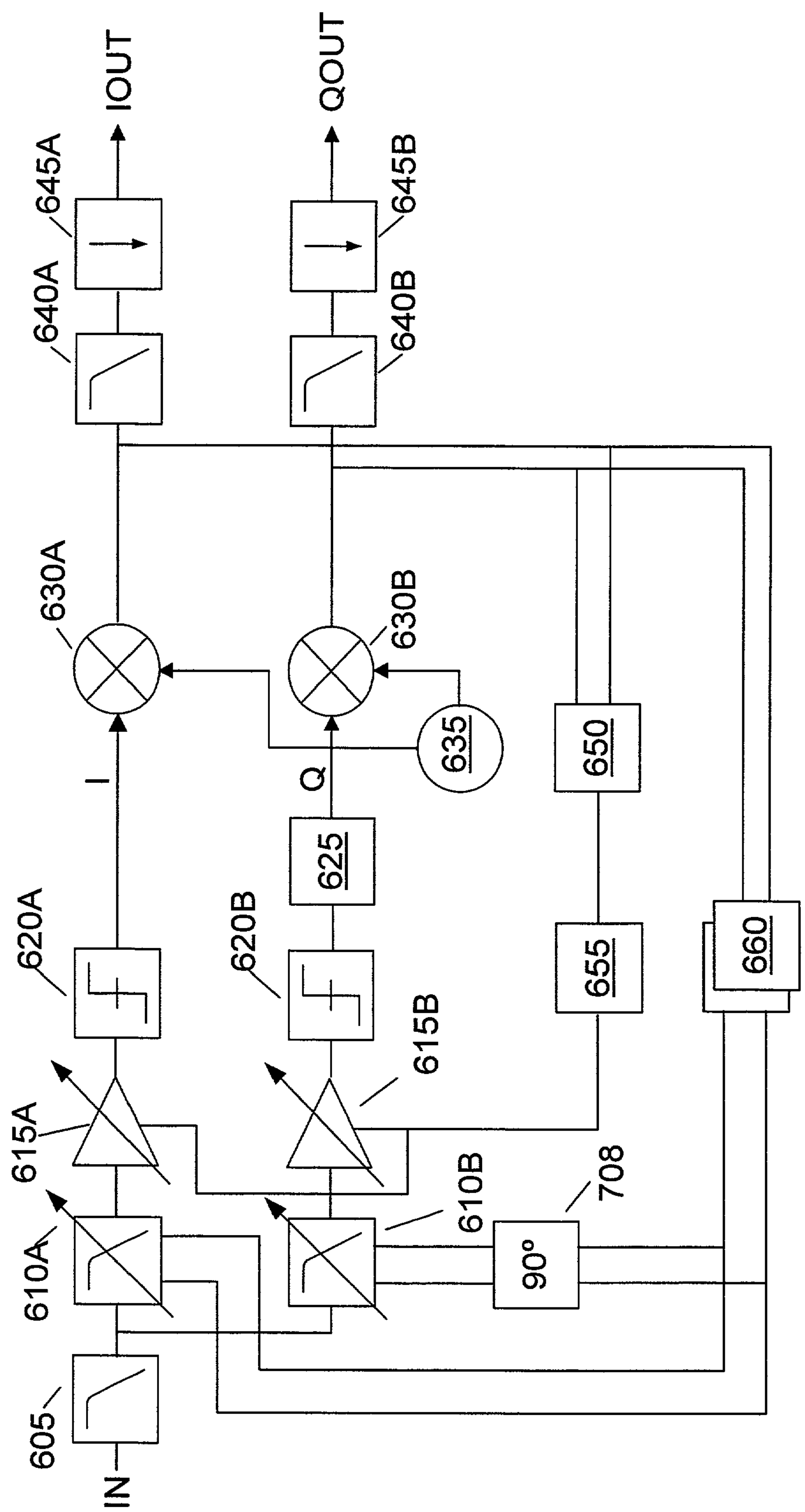
FIG. 7 is a block diagram of another embodiment of the present invention.

FIG. 7 is a block diagram of another embodiment of the present invention. In this case a desired IF signal is complex downconverted to a lower IF frequency, but not to baseband. This embodiment differs from the embodiment of FIG. 6 in that separate I and Q channels are established immediately after the anti-aliasing filter 605. Thus, there are two separate SC networks 610A (I channel) and 610B (Q channel), two separate amplifiers 615A and 615B, and two separate digitizers 620A and 620B. In addition, there is a 90° phase shifter 708 added between the tuning circuit 660 and one of the filters 610A, 610B. This phase shifter 708 removes the need for the oscillator 635 to produce different signals for the I and Q channels. Therefore, a single output signal from oscillator 635 may be used as the input to both complex mixers 630A and 630B. It is a matter of design choice as to which of the filters 610A, 610B receives the phase shifted signals. It is also a matter of design choice as to whether one network 610 receives a phase shifted signal and the other does not, or whether both filters 610 receive differently phase-shifted signals, as long as the phase difference is approximately 90°. The spectrums for this embodiment are those shown in FIGS. 5A and 5B. Thus, the input signal has been sampled and downshifted, interpolated, and complex-converted down to baseband, and a first phase output signal (which may be either the I channel or the Q channel) and second phase output signal (which is the other channel) have been provided, where the first phase output signal and the second phase output signal preferably differ by 90 degrees.

Thus, in this embodiment, the receiver includes dual switched capacitor networks (610A, 610B) and may include dual AGCs (615A, 615B), and dual ADCs (620A, 620B)

Figure 8:
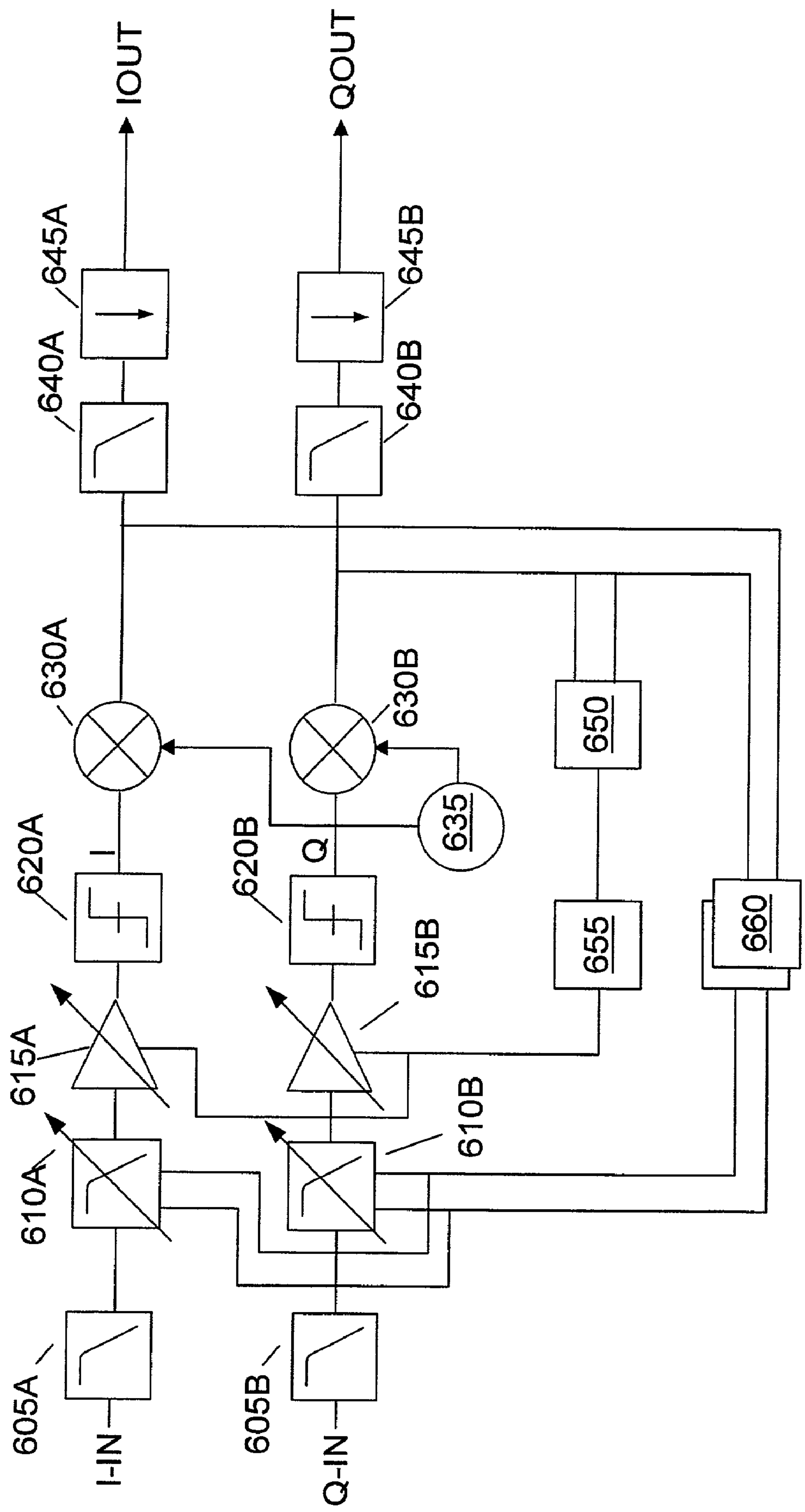
FIG. 8 is a block diagram of another embodiment of the present invention.

FIG. 8 is a block diagram of another embodiment of the present invention. In this case a complex desired IF signal is downconverted to a lower IF frequency, but not to baseband. This embodiment differs from the embodiment of FIG. 6 in that separate I and Q channels are established before the anti-aliasing filter 605. Thus, there are two separate anti-aliasing filters 605A (I channel) and 605B (Q channel), two separate SC networks 610A and 610B, two separate amplifiers 615A and 615B, and two separate digitizers 620A and 620B. Note that the interpolating filter 625 of FIG. 6 has been eliminated. Note that the two SC networks 610 are driven with the same phase signal. The spectrums for this embodiment are also those shown in FIGS. 5A and 5B. Thus, the input signal has been sampled, downshifted, and complex-converted down to baseband, and a first phase output signal (which may be either the I channel or the Q channel) and second phase output signal (which is the other channel) have been provided, where the first phase output signal and the second phase output signal preferably differ by 90 degrees.

Thus, in this embodiment, the receiver includes dual filters (605A, 605B), dual switched capacitor networks (610A, 610B) and may include dual AGCs (615A, 615B), and dual ADCs (620A, 620B).

Figure 9:
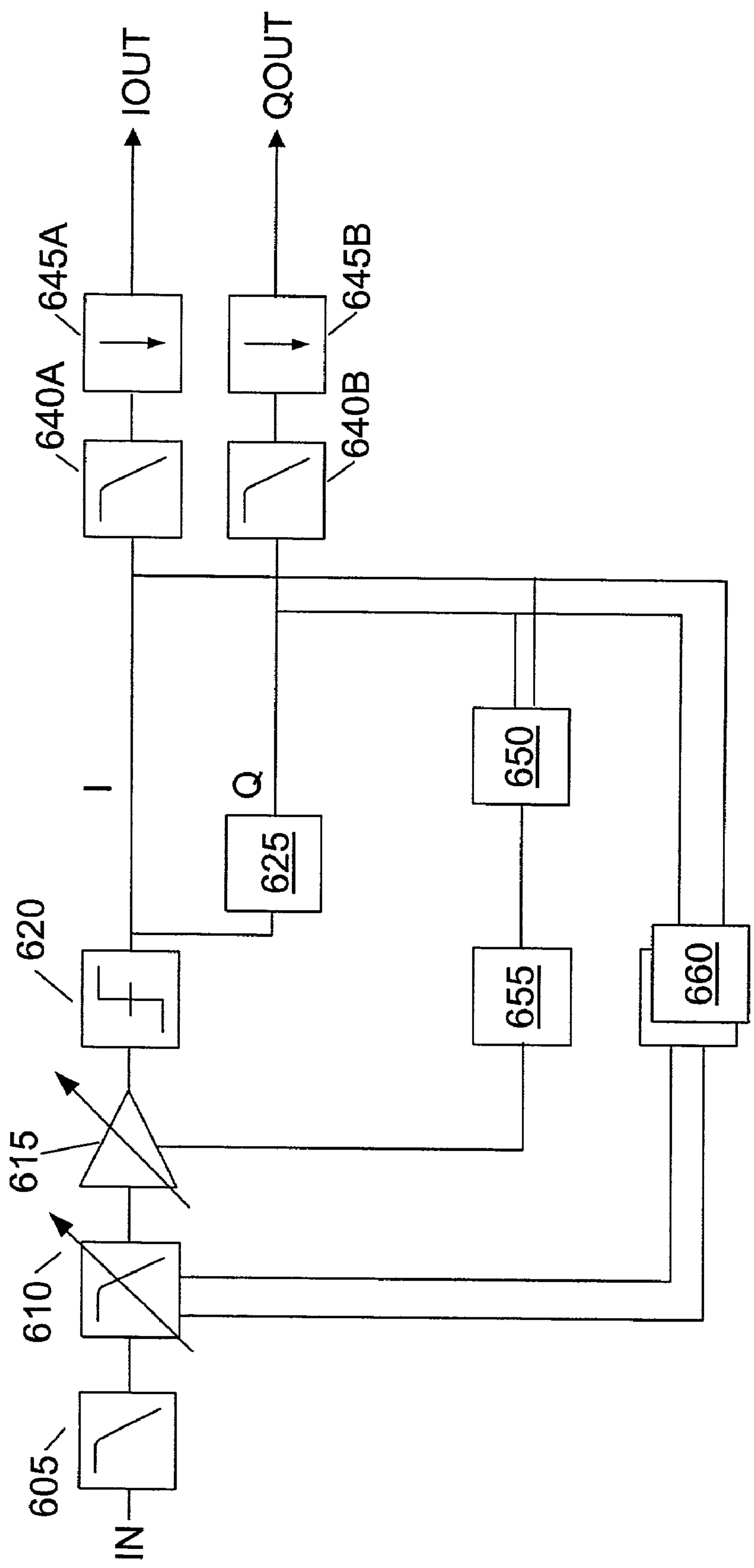
FIG. 9 is a block diagram of another embodiment of the present invention.

FIG. 9 is a block diagram of another embodiment of the present invention. In this embodiment the desired IF signal is downconverted directly to baseband. This embodiment differs from the embodiment of FIG. 6 in that the oscillator 635 and the complex mixers 640A and 640B have been eliminated. As mentioned earlier, direct downconversion to baseband is generally undesirable because a low phase jitter for the sample clock becomes extremely critical.

Thus, in this embodiment, the phase recovery circuit includes an interpolating filter 625.

In a variation of the embodiment of FIG. 9, part of the single channel input (the single SC network 610, the single AGC amplifier 615, and the single ADC 620) is replaced with the dual channel configuration of FIG. 7 (dual SC networks 610A and 610B, dual AGC amplifiers 615A and 615B, dual ADCs 620A and 620B, and phase shifter 708).

In another variation of the embodiment of FIG. 9, the single channel input (the single filter 605, the single SC network 610, the single AGC amplifier 615, and the single ADC 620) is replaced with the dual channel input of FIG. 8 (dual filters 605A and 605B, dual SC networks 610A and 610B, dual AGC amplifiers 615A and 615B, and dual ADCs 620A and 620B).

In the preferred and alternative embodiments described above with respect to FIGS. 6 through 9, the AGC amplifier 615 has been shown as following the SC network(s) 610.

However, this is a design choice and is not a requirement. In one variation, the AGC amplifier 615 may precede the SC network(s) 610. In another variation, two AGC amplifiers 615 may be used, one preceding the SC network(s) 610, and one following the SC network(s) 610.

Therefore, the receiver of the present invention may be considered as including a switched capacitor network (610) for sampling a desired input signal (IN) at a sampling frequency (FS) to provide a downconverted desired signal, and a phase recovery circuit (625, 626, 630A, 630B, 635) functionally connected to said switched capacitor network and responsive to said downconverted desired signal for providing a first phase signal and a second phase signal. The sampling frequency is less than the center frequency of the desired input signal, and a harmonic of the sampling frequency is related to the center frequency of the desired input signal. Filtering (640A, 640B) and decimation (645A, 645B) may also be added, or may be considered to be part of the phase recovery circuit. AGC amplifiers (615) and ADCs (620) may also be present. In addition, AGC control circuitry (650, 655) and tuning control circuitry (660) may also be present.

Therefore, the present invention has provided for the use of an SC network to provide for both tuning and downconversion of a desired signal so as to eliminate the need for separate and discrete component tuning and IF filter circuits, thus saving power, space, and cost.

The present invention also provides for saving power, heat dissipation requirements, and money by allowing the use of a lower frequency IF amplifier.

The present invention also provides for saving power, heat dissipation requirements, and money by allowing the use of a lower frequency digitizer.

Although the present invention has been described above with respect to particular environments, such as a typical consumer FM radio and in a cellular system, the present invention is not limited thereto. The present invention is also useful with AM and FM radios and communications systems in general including, by way of example and not of limitation, Satellite Digital Audio Radio Services (SDARS). Some, but not all, examples of SDARS which include Sirius™ Satellite Radio, XM™ Radio, Eureka™ 147 DAB (digital audio broadcasting), and Ibiquity™ Digital Audio Broadcasting (iDAB).

Although the present invention has been described with particularity, variations thereof may become apparent after reading of the detailed description and viewing the drawings herein. Therefore, the scope of the present invention is limited only by the claims below.

I claim:

1. A method for processing a desired signal having a center frequency, comprising the steps of:

providing a sampling signal having a sampling frequency, the sampling frequency being less than the center frequency of the desired signal, a harmonic of the sampling frequency being related to the center frequency of the desired signal;

filtering the desired signal through a switched capacitor network being clocked at the sampling frequency to provide an analog downconverted desired signal; and recovering a first phase signal and a second phase signal from the downconverted desired signal, the recovering including:

converting the analog downconverted desired signal into a digital downconverted desired signal;

interpolating the digital downconverted desired signal to provide an interpolated desired signal;

mixing the digital downconverted desired signal with a mixing signal to provide the first phase signal; and mixing the interpolated desired signal with the mixing signal to provide the second phase signal.

2. A method for processing a desired signal having a center frequency, comprising the steps of:

providing a sampling signal having a sampling frequency, the sampling frequency being less than the center frequency of the desired signal, a harmonic of the sampling frequency being related to the center frequency of the desired signal;

filtering the desired signal through a switched capacitor network being clocked at the sampling frequency to provide a downconverted desired signal, the filtering including:

providing the desired signal to a first switched capacitor network being clocked at the sampling frequency at a first phase to provide a first downconverted desired signal; and providing the desired signal to a second switched capacitor network being clocked at the sampling frequency at a second phase to provide a second downconverted desired signal, the first phase and the second phase differing by approximately 90 degrees; and recovering a first phase signal and a second phase signal from the downconverted desired signal, the recovering including:

interpolating the second downconverted desired signal to provide an interpolated desired signal;

mixing the first desired signal with a mixing signal to provide the first phase signal; and mixing the interpolated desired signal with the mixing signal to provide the second phase signal.

3. A method for processing a desired signal having a center frequency and including a first phase desired signal and a second phase desired signal, the method comprising the steps of:

providing a sampling signal having a sampling frequency, the sampling frequency being less than the center frequency of the desired signal, a harmonic of the sampling frequency being related to the center frequency of the desired signal;

filtering the desired signal through a switched capacitor network being clocked at the sampling frequency to provide a downconverted desired signal, the filtering including:

providing the first phase desired signal to a first switched capacitor network being clocked at the sampling frequency to provide a first phase downconverted desired signal; and providing the second phase desired signal to a second switched capacitor network being clocked at the sampling frequency to provide a second phase downconverted desired signal; and recovering a first phase signal and a second phase signal from the downconverted desired signal, the recovering including:

mixing the first phase downconverted desired signal with a mixing signal to provide the first phase signal; and mixing the second phase downconverted desired signal with the mixing signal to provide the second phase signal.

4. A method for processing a desired signal having a center frequency, comprising the steps of:

providing a sampling signal having a sampling frequency, the sampling frequency being less than the center frequency of the desired signal, a harmonic of the sampling frequency being related to the center frequency of the desired signal;

filtering the desired signal through a switched capacitor network being clocked at the sampling frequency to provide an analog downconverted desired signal;

converting the analog downconverted desired signal into a digital desired signal; and recovering a first phase signal and a second phase signal from the digital desired signal, the recovering step including:

interpolating the digital desired signal to provide an interpolated desired digital signal;

mixing the digital desired signal with a mixing signal to provide the first phase signal; and mixing the interpolated digital signal with the mixing signal to provide the second phase signal.

5. A method for processing a desired signal having a center frequency, comprising the steps of:

providing a sampling signal having a sampling frequency, the sampling frequency being less than the center frequency of the desired signal, a harmonic of the sampling frequency being related to the center frequency of the desired signal;

filtering the desired signal through a switched capacitor network being clocked at the sampling frequency to provide a downconverted desired signal;

adjusting the amplitude of the downconverted desired signal for subsequent conversion into a digital desired signal;

converting the downconverted desired signal into the digital desired signal; and recovering a first phase signal and a second phase signal from the digital desired signal, the recovering step including:

interpolating the digital desired signal to provide an interpolated desired digital signal;

mixing the digital desired signal with a mixing signal to provide the first phase signal; and mixing the interpolated digital signal with the mixing signal to provide the second phase signal.

6. A method for processing a desired signal having a center frequency, comprising the steps of:

providing a sampling signal having a sampling frequency, the sampling frequency being less than the center frequency of the desired signal, a harmonic of the sampling frequency being related to the center frequency of the desired signal;

filtering the desired signal through a switched capacitor network being clocked at the sampling frequency to provide a downconverted desired signal;

adjusting the amplitude of the downconverted desired signal in response to a gain control signal for subsequent conversion into a digital desired signal;

converting the downconverted desired signal into the digital desired signal; and recovering a first phase signal and a second phase signal from the digital desired signal, the recovering step including:

interpolating the digital desired signal to provide an interpolated desired digital signal;

mixing the digital desired signal with a mixing signal to provide the first phase signal; and mixing the interpolated digital signal with the mixing signal to provide the second phase signal.

7. A method for processing a desired signal having a center frequency, comprising the steps of:

adjusting the amplitude of the desired signal to provide an adjusted desired signal;

providing a sampling signal having a sampling frequency, the sampling frequency being less than the center frequency of the desired signal, a harmonic of the sampling frequency being related to the center frequency of the desired signal;

filtering the adjusted desired signal through a switched capacitor network being clocked at the sampling frequency to provide an analog downconverted desired signal;

converting the analog downconverted desired signal into the digital desired signal; and recovering a first phase signal and a second phase signal from the digital desired signal, the recovering step including:

interpolating the digital desired signal to provide an interpolated desired digital signal;

mixing the digital desired signal with a mixing signal to provide the first phase signal; and mixing the interpolated digital signal with the mixing signal to provide the second phase signal.

8. A method for processing a desired signal having a center frequency, comprising the steps of:

adjusting the amplitude of the desired signal in response to a gain control signal to provide an adjusted desired signal;

providing a sampling signal having a sampling frequency, the sampling frequency being less than the center frequency of the desired signal, a harmonic of the sampling frequency being related to the center frequency of the desired signal;

filtering the adjusted desired signal through a switched capacitor network being clocked at the sampling frequency to provide an analog downconverted desired signal;

converting the analog downconverted desired signal into the digital desired signal; and recovering a first phase signal and a second phase signal from the digital desired signal, the recovering step including:

interpolating the digital desired signal to provide an interpolated desired digital signal;

mixing the digital desired signal with a mixing signal to provide the first phase signal; and mixing the interpolated digital signal with the mixing signal to provide the second phase signal.

9. A frequency conversion circuit for receiving a desired input signal having a center frequency, the frequency conversion circuit comprising:

a switched capacitor network for sampling the desired input signal at a sampling frequency to provide an analog downconverted desired signal, the sampling frequency being less than the center frequency of the desired input signal, a harmonic of the sampling frequency being related to the center frequency of the desired input signal;

a phase recovery circuit functionally connected to the switched capacitor network and responsive to the analog downconverted desired signal for providing a first phase signal and a second phase signal; and an analog-to-digital converter for converting the analog downconverted desired signal into a digital downconverted desired signal for provision to the phase recovery circuit, and wherein the phase recovery circuit comprises an interpolating filter for interpolating the digital downconverted desired signal to provide a digital interpolated downconverted desired signal, an oscillator for providing a mixer signal, a first mixer responsive to the digital downconverted desired signal and the mixer signal for providing a digital first phase signal as the first phase signal, and a second mixer responsive to the digital interpolated downconverted desired signal and the mixer signal for providing a digital second phase signal as the second phase signal.

* * * * *